(12) United States Patent
Kawano

(10) Patent No.: US 6,411,243 B1
(45) Date of Patent: Jun. 25, 2002

(54) MODE CONTROL CIRCUIT

(75) Inventor: Tsutomu Kawano, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 35 days.

(21) Appl. No.: 09/717,208

(22) Filed: Nov. 22, 2000

(30) Foreign Application Priority Data

Jul. 10, 2000 (JP) ........................................ 2000-208852

(51) Int. Cl.⁷ ................................................ H03M 1/00
(52) U.S. Cl. ...................................................... 341/155
(58) Field of Search ................................. 341/155, 110, 341/126, 139, 156, 161, 162, 170

(56) References Cited

U.S. PATENT DOCUMENTS 6,281,829 B1 * 8/2001 Amrany ...................... 341/155

FOREIGN PATENT DOCUMENTS

JP 6-152377 5/1994

* cited by examiner

Primary Examiner—Brian Young
(74) Attorney, Agent, or Firm—Leydig, Voit & Mayer, Ltd.

(57) ABSTRACT

At a node N, a potential level to be supplied to a first comparator and a second comparator in a subsequent stage is changed by turning a switch on to provide a current to a signal output terminal, and, by turning another switch on to switch a current out of the signal output terminal. The signal output terminal serves not only as a terminal for outputting a signal generated inside a semiconductor integrated circuit, but also provides concurrent use as a control terminal response to external current control.

9 Claims, 6 Drawing Sheets

MODE CONTROL CIRCUIT

FIELD OF THE INVENTION

The present invention relates to a mode control circuit provided inside a semiconductor integrated circuit, which mode control circuit controls actions and functions of the semiconductor integrated circuit based on a control signal from outside.

BACKGROUND OF THE INVENTION

The semiconductor integrated circuit (hereinafter referred to as "IC") needs to have an increased number of input/output terminals for higher functionality to be achieved, while meeting requirements for smaller sizes, and is necessarily subjected to a limitation on a pitch of the input/output terminals.

A method of performing the original number of functions with a reduced number of input/output terminals is known. The IC is provided with a control terminals for inputting a signal from outside, and an encoder circuit. By changing the voltage level of the signal supplied from outside a greater number of functions or conditions may be controlled without increasing the number of the control terminals.

In particular, recent years have observed serial control systems for a plurality of conventional functions as well as conditions to be controlled with merely one to three control terminals, such as by changing a voltage level of a control signal input into a control terminal, or by time-sequentially changing pulse intervals. The serial control systems are implemented generally by provision of a mode control circuit in the IC.

FIG. 5 is a circuit diagram of a conventional mode control circuit. In particular, this figure shows a mode control circuit of the type in which functions may be selected by changing a voltage level of a control signal input into a single control terminal. This mode control circuit comprises a first comparator 101 which compares the voltage level of a control signal input into a control terminal 100 and a predetermined threshold voltage $V_1$ and outputs the result of such comparison in the form of a logic level, a second comparator 102 which compares the voltage level of the control signal input into the control terminal 100 and a predetermined threshold voltage $V_2$ and outputs the result of such comparison in the form of a logic level, and an encoder 110 which receives the comparison results in the form of logical levels from the first comparator 101 and the second comparator 102 input thereto to have only one of the three outputs selected as effective.

The encoder 110 is constituted with an inverter 106 which inverts the logic level output by the first comparator 101, an inverter 105 which inverts the logic level output by the second comparator 102, a 2-input NAND gate 107 to which the logic levels output by the first comparator 101 and the second comparator 102 are input. A 2-input NAND gate 108 receives the outputs of the inverter 105 and the inverter 106. A 2-input NAND gate 109 receives the outputs of the inverter 106 and the logic level output by the second comparator 102. The NAND gates 107, 108, and 109 output signals OUT1, OUT2, and OUT3 respectively. In other words, this mode control circuit is adapted to select any of three functions with a single control terminal 100.

FIG. 6 is a circuit diagram of the first comparator 101. The second comparator 102 has the same structure. The first comparator 101 comprises a constant current source 120, a differential pair of PNP transistors TN11 and TN12, a current mirror circuit of NPN transistors TP11 and TP12, a first emitter follower circuit (level shift circuit) made of a resistor R11 and a PNP transistor TN13, a second emitter follower circuit made of a resistor R12 and a PNP transistor TN14, and resistors R13 and R14 for dividing a power supply voltage $V_{cc}$ to generate the threshold voltage.

In other words, the comparator shown in FIG. 6 serves as a differential amplifier circuit to output at a node OUT a current proportional to a difference between a voltage level at an input terminal IN (which is the same as the control terminal 100) and a predetermined voltage (the threshold voltage) across the two terminals of the resistor R14. Incidentally, the first emitter follower circuit and the second emitter follower circuit are provided to keep the PNP transistors TN11 and TN12 respectively from getting saturated even when a low voltage near a ground potential GND is given to the input terminal IN.

The working of the comparator 101 will be explained here. When the voltage level given to the input terminal IN is lower than a base potential of the PNP transistor TN14, that is, when the voltage level of a control signal input into the control terminal 100 is lower than the threshold voltage of the comparator, then the base potential of the PNP transistor TN11 becomes greater than a base voltage of the PNP transistor TN12 and therefore the current of the constant current source 120 is nearly all conducted to the PNP transistor TN11.

At this time, by a function of the current mirror circuit including the PNP transistors TN11 and TN12, there is a tendency for the PNP transistor TP12 to draw out a current from the PNP transistor TN12 so as to conduct the same current as a current conducted via the PNP transistor TN11 and through the PNP transistor TP11. However, because the current of the constant current source 120 is nearly all conducted to the PNP transistor TN11 as described, the current to be supplied from the PNP transistor TN12 becomes smaller, with a resultant failure to take out a substantial current from the node OUT, so that a low logic level is output from the comparator.

On the contrary, if the voltage level given to the input terminal IN is higher than the base potential of the PNP transistor TN14, that is, when the voltage level of the control signal to be input into the control terminal 100 is higher than the threshold voltage of the comparator, then the base potential of the PNP transistor TN11 becomes smaller than the base potential of the PNP transistor TN12 and therefore the current of the constant current source 120 is almost conducted to the PNP transistor TN12.

In other words, the PNP transistor TN11 fails to have a substantial current conducted therethrough, and by a function of the current mirror circuit including the PNP transistors TN11 and TN12, the PNP transistor TP12 is caused draw out from the PNP transistor TN12 a faint identical current to a current conducted via the PNP transistor TN11 and through the PNP transistor TP11. Therefore, most of the current supplied from the PNP transistor TN12 is taken out of the node OUT, with a result that a high logic level is output from the comparator.

Next, working of the mode control circuit will be explained with an assumption that the threshold voltage $V_1$ of the first comparator 101 to be $\frac{2}{3}$ of the power supply voltage $V_{cc}$, and the threshold voltage $V_2$ of the second comparator 102 to be $\frac{1}{3}$ of the power supply voltage $V_{cc}$.

When the voltage level of the control signal is greater than the threshold voltage $V_1$ of the first comparator 101 (i. e. $\frac{2}{3}$ $V_{cc}$), the first comparator 101 and the second comparator 102 both output a high logic level. Accordingly, in the encoder 110, the NAND gates 108 and 109 output a low logic level and the NAND gate 107 outputs a high logic level. As a consequence, only the signal OUT1 is selected (i.e. output).

When the voltage level of the control signal is lower than the threshold voltage $V_2$ of the second comparator 102 (i. e. ⅓ $V_{cc}$), the first comparator 101 and the second comparator 102 both output a low logic level. Accordingly, in the encoder 110, the NAND gates 107 and 109 output a low logic level and the NAND gate 108 outputs a high logic level. As a consequence, only the signal OUT2 is output.

Finally, when the voltage level of the control signal intervenes between the threshold voltage $V_1$ and the threshold voltage $V_2$, the first comparator 101 outputs a low logic level and the second comparator 102 outputs a high logic level. Accordingly, in the encoder 110, the NAND gates 107 and 108 output a low logic level and the NAND gate 109 outputs a high logic level. As a consequence, only the signal OUT3 is output.

In the conventional mode control circuit, it is enough to provide a few control terminals to control a plurality of functions or conditions in the semiconductor integrated circuit. However, this means that there is at least a need to provide dedicated control terminals for inputting the control signals.

SUMMARY OF THE INVENTION

It is an object of the present invention to provide a mode control circuit in which there is no need to provide dedicated terminals for inputting control signals. This is realized by provision of signal output terminals which can be also used as the control terminals. Since dedicated control terminals are not provided, the number of input/output terminals in a semiconductor integrated circuit can be reduced.

The mode control circuit of the present invention comprises an encoding unit which makes any of a plurality of signal outputs effective in accordance with a given signal level. Further, a mode control unit changes a potential level to be given to the encoding unit, at a signal output terminal for outputting an internally generated signal generated inside a semiconductor integrated circuit, in accordance with an input of a predetermined current from outside or with an output of a predetermined current from the signal output terminal to outside.

According to the present invention, the mode control unit changes the voltage level changed to be given to the encoder based on a current given from outside to a signal output terminal or suctioned out of the signal output terminal. Thus, the signal output terminal can concurrently serve not simply for outputting a signal generated inside the semiconductor integrated circuit, but also as a control terminal to input a control current.

Further, the mode control unit comprises three transistors, two constant current sources, and two load resistors. Thus, the configuration is simple.

Further, means for implementing the input of the predetermined current to the signal output terminal from outside or the output of the predetermined current from the signal output terminal to outside comprises a load resistor for giving a current from a power supply line to the signal output terminal, a load resistor for suctioning a current from a grounding line and the signal output terminal, and two switches for controlling the respective currents to inflow or outflow. Thus, the configuration is simple.

Further, means for having the signal output terminal outputting predetermined currents therefrom comprises two load resistors for suctioning the currents from the signal output terminal to a grounding line, and two switches for controlling the respective currents to be suctioned. Thus, the configuration is simple.

Further, means for inputting predetermined currents from outside to the signal output terminal comprises two load resistors for giving the currents from a power supply line to the signal output terminal, and two switches for controlling the respective currents to inflow. Thus, the configuration is simple.

Further, the second constant current source can have a current reduced to 1/n (where n is the transistor size of the first transistor when the transistor size of the second transistor is 1) of a current of the first constant current source, and the first and second load resistors are allowed to have increased values to give a signal of a stable potential level to the post-staged the encoding unit, whereby the capacitance of a capacitor C can be reduced.

Other objects and features of this invention will become apparent from the following description with reference to the accompanying drawings.

DESCRIPTION OF THE PREFERRED EMBODIMENTS

Preferred embodiments of mode control circuits according to the present invention will be described below with reference to the accompanying drawings. The invention however is not limited by those embodiments.

Figure 1:
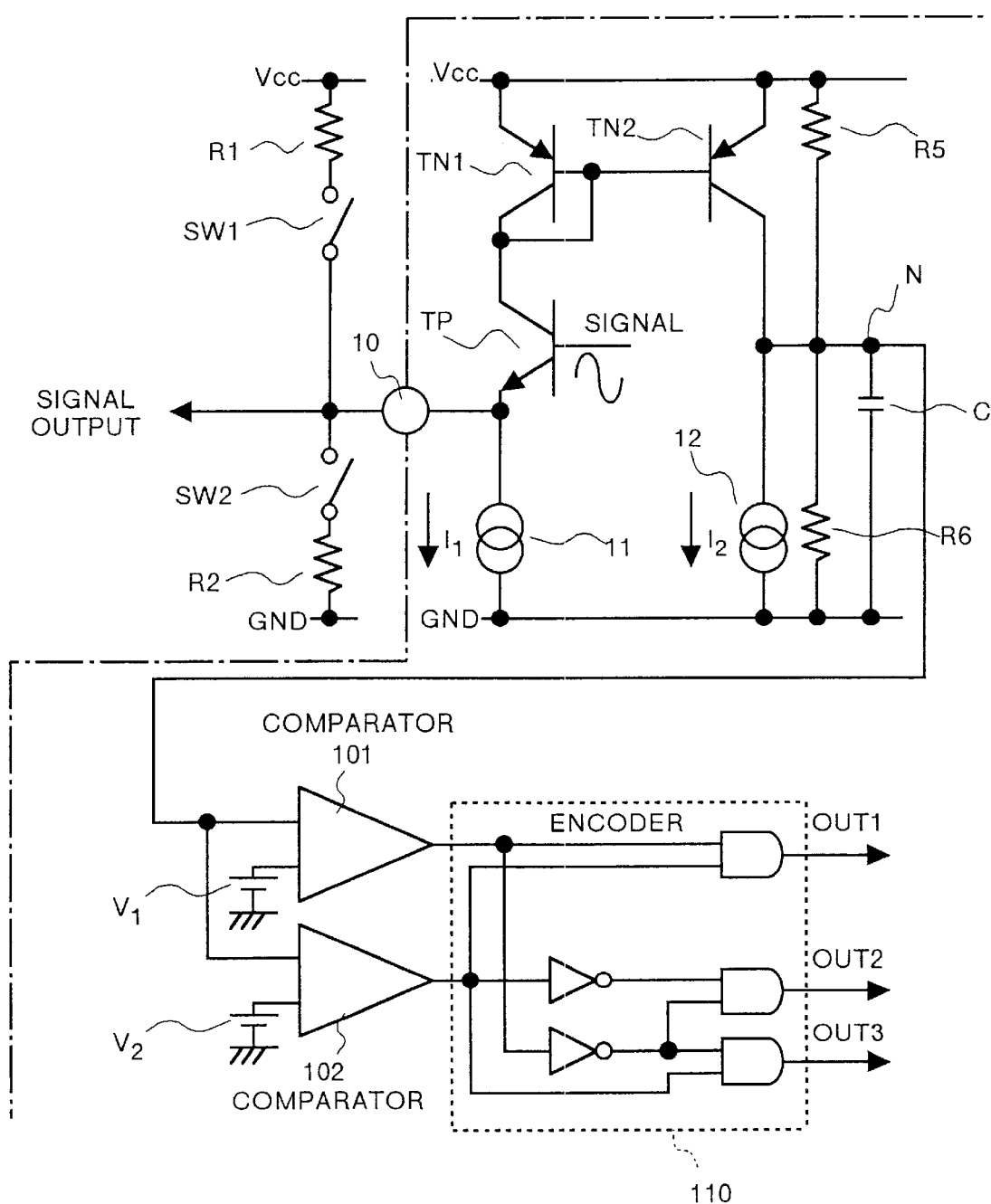
FIG. 1 is a circuit diagram of a mode control circuit according to a first embodiment of the present invention.

A mode control circuit according to a first embodiment of the invention will be explained first. FIG. 1 is a circuit diagram of the mode control circuit according to the first embodiment. This mode control circuit includes a current mirror circuit having a PNP transistor TN1 with an emitter connected to a power supply line and with a base and a collector connected to each other, and another PNP transistor TN2 with an emitter connected to the power supply line and with a base connected to the base of the PNP transistor TN1.

The mode control circuit further includes an NPN transistor TP having a base for inputting thereto "a variety of signals generated within a semiconductor integrated circuit, to be output therefrom" (hereinafter collectively called "internally generated signal"), a collector connected to the collector of the PNP transistor TN1, and an emitter connected to a signal output terminal 10 for outputting the internally generated signal.

The mode control circuit further includes a constant current source 11 disposed between the emitter of the NPN transistor TP and a grounding line, another constant current source 12 disposed between a collector of the PNP transistor TN2 and the grounding line, a load resistor R5 connected at one end thereof to the power supply line and at the other end to the collector of the PNP transistor TN2, another load resistor R6 connected at one end thereof to the collector of the PNP transistor TN2 and at the other end to the grounding line, and a capacitor C connected at one end thereof to the collector of the PNP transistor TN2 and at the other end to the grounding line. A junction between the collector of the PNP transistor TN2 and the above-noted elements will be referred to as a node N.

Figure 5:
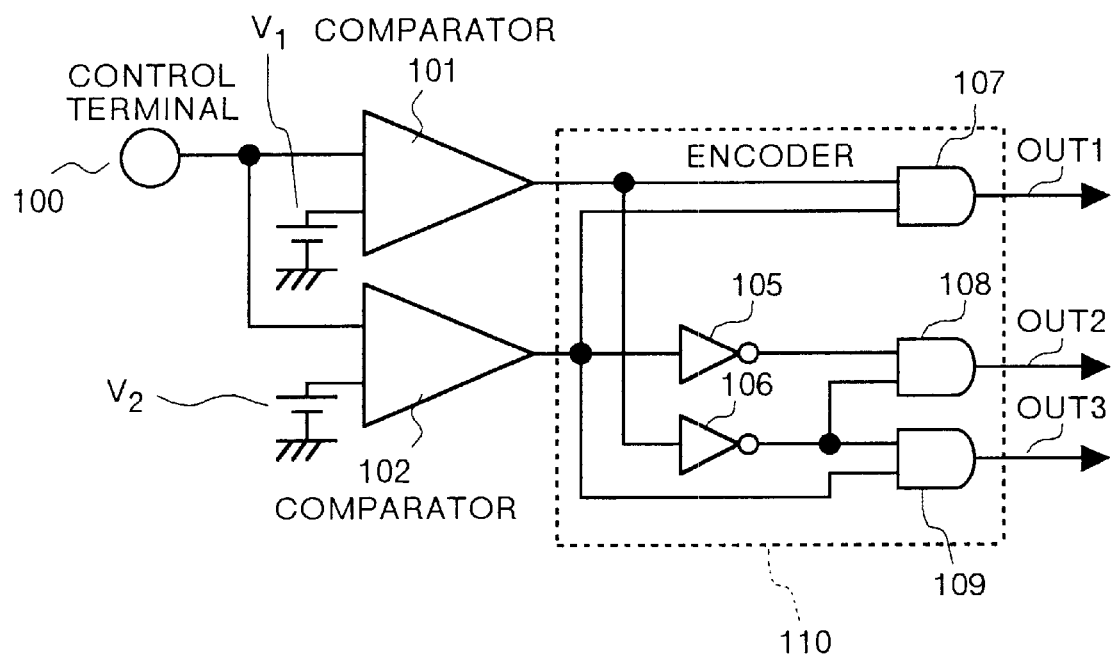
FIG. 5 is a circuit diagram of a conventional mode control circuit.
Figure 6:
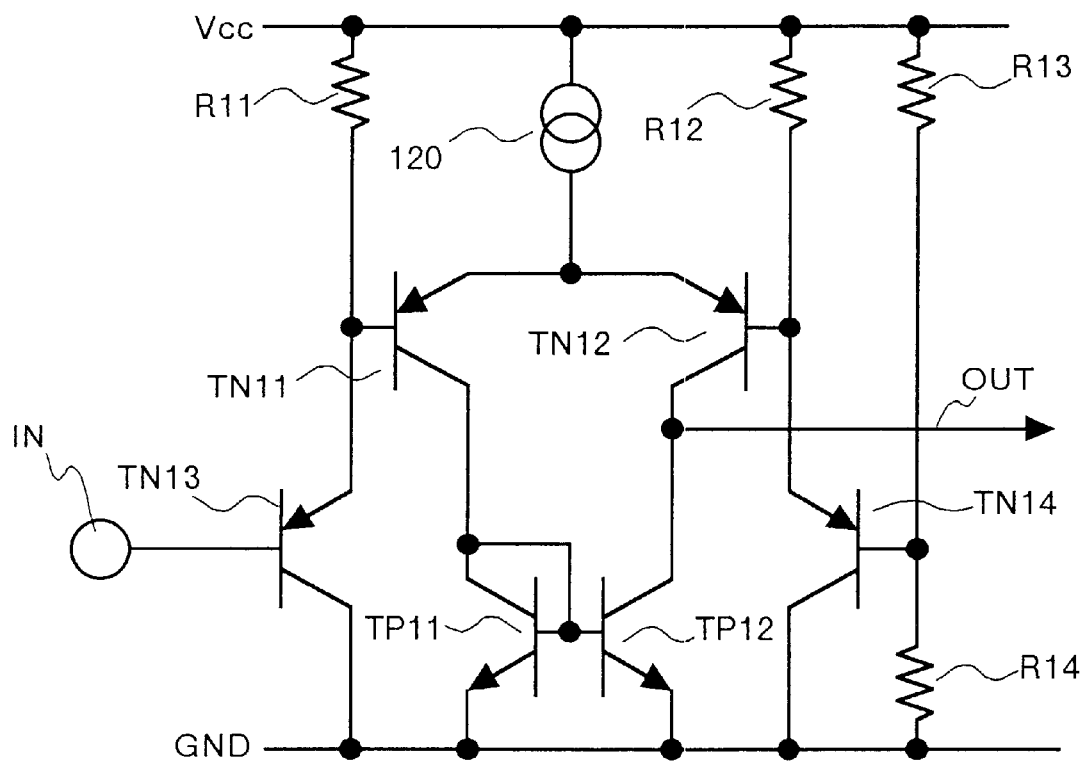
FIG. 6 is a circuit diagram of a comparator in the conventional mode control circuit.

The node N is connected to a node that corresponds to the control terminal 100 of the conventional mode control circuit shown in FIG. 5. Parts which have same functions as the parts shown in FIG. 5 are designated with same legends and their description is omitted.

It should now be noted that the signal output terminal 10 functioning to output the internally generated signal is allowed to function as a control terminal, as well, by externally connecting thereto a control signal generating circuit constituted with a load resistor and a switch, as will be described later.

Working of the mode control circuit according to the present embodiment will be explained here. For the mode control circuit to be implemented with characteristic functions, it is necessary to connect a control signal generating circuit to the signal output terminal 10 outside the semiconductor integrated circuit. The signal generating circuit is made up by a load resistor R1 connected at one end thereof to a power supply line, a switch SW1 connected at one of contact terminals thereof to the other end of the load resistor R1 and at the other contact terminal to the signal output terminal 10, another load resistor R2 connected at one end thereof to a grounding line, and another switch SW2 connected at one of contact terminals thereof to the other end of the load resistor R2 and at the other contact terminal to the signal output terminal 10. Following three cases may arise based on the states of the switches.

(1) Both the Switches SW1 and SW2 are Off:

Consider that the switches SW1 and SW2 are both turned off. Further, let us assume that the constant current source 11 outputs a supply current of magnitude $I_1$ and the constant current source 12 outputs a supply current of magnitude $I_2$.

As the switches SW1 and SW2 are both off, the mode control circuit makes an equivalent action to a condition in which the signal output terminal 10 is not connected to the control signal generating circuit. Therefore, the supply current $I_1$ from the constant current source 11 flows via the NPN transistor TP and through the PNP transistor TN1 without substantial attenuation. Because the PNP transistor TN1 constitutes a current mirror circuit together with the PNP transistor TN2, an identical current $I_1$ is conducted through the PNP transistor TN2 also.

If the supply current $I_2$ from the constant current source 12 is set such that $I_2=I_1$, then no current flows at the node N. Therefore, the potential at the node N is simply equal to a voltage to be imposed on the load resistor R6 when a power supply voltage $V_{cc}$ is divided by the load resistors R5 and R6.

Assuming now that the resistances of the load resistor R5 and the load resistor to be equal, the potential at the node N has a value of ½ $V_{cc}$ (i.e. one half of the power supply voltage). This potential ½ $V_{cc}$ is then input into the first comparator 101 and the second comparator 102, causing actions explained in connection to conventional mode control circuit, so that only a signal OUT3 of high logic level is output, again on the assumption for a threshold voltage $V_1$ of the first comparator 101 to be ⅔ $V_{cc}$ and for a threshold voltage $V_2$ of the second comparator 102 to be ⅓ $V_{cc}$.

(2) The Switch SW1 is On and the Switch SW2 is Off:

As the switch SW1 is on, the signal output terminal 10 has a current inflowing thereto via the load resistor R1 from the power supply line. The magnitude of the inflowing current is $I_{in}$=(power supply voltage $V_{cc}$–potential at the signal output terminal 10)/(resistance of the load resistor R1).

Therefore, a current of $I_1-I_{in}$ is conducted through the NPN transistor TP and the PNP transistor TN1, and by a function of the current mirror circuit, the PNP transistor TN2 also has a current of $I_1-I_{in}$ conducted therethrough. However, on the assumption that the magnitude $I_2$ of the constant current source 12 is set to be equal to the current value $I_1$ there occurs a lack of current of $I_2-(I_1-I_{in})=I_{in}$ in value. To make up for the lack, the constant current source 12 suctions a current from the load resistors R5 and R6 at the node N.

Figure 2:
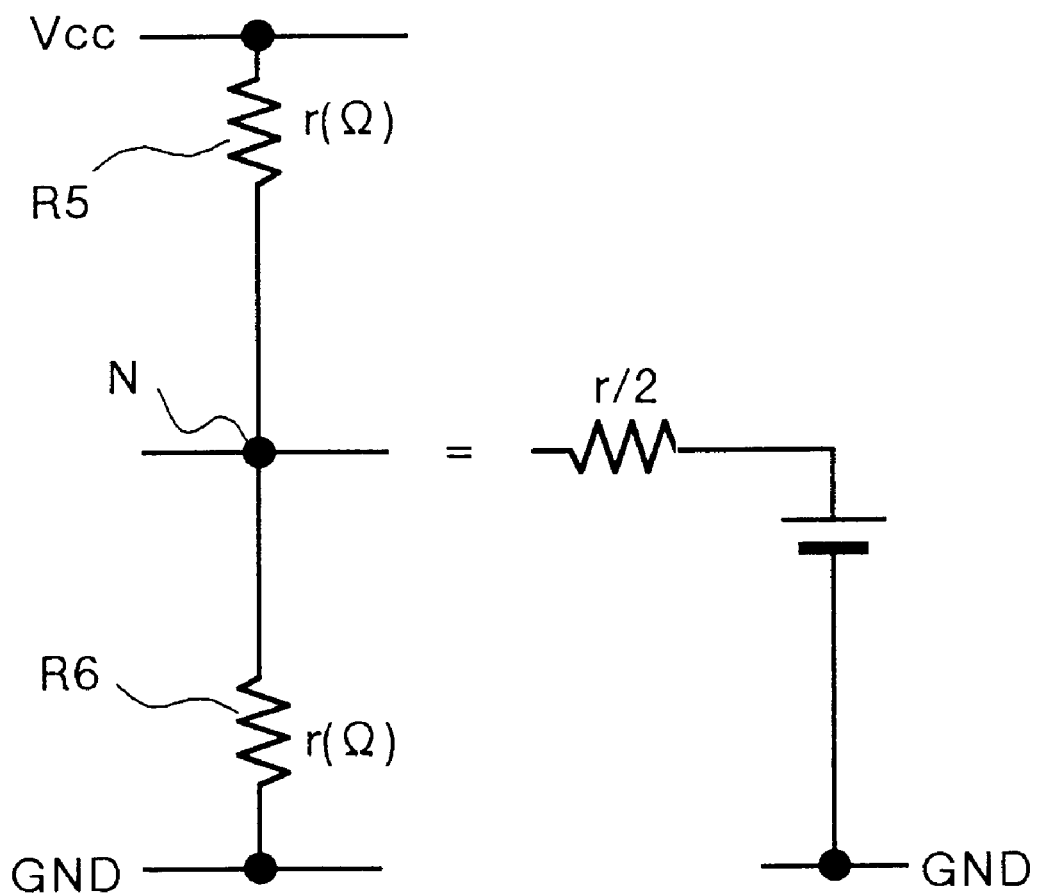
FIG. 2 is a diagram describing an equivalent circuit of load resistor portion in the mode control circuit according to the first embodiment.

FIG. 2 is a diagram describing an equivalent circuit of the load resistors R1 and R2 in this case. As shown in FIG. 2, the node N has a potential of ½ $V_{cc}$ –((resistance value r/2 of the load resistors R1 and R2)×$I_{in}$). Therefore, the potential of the node N depends on the load resistor R1 of the control signal generating circuit and $I_{in}$ (that is a potential of the signal output terminal 10).

This means that, by selecting the load resistor R1 having a proper resistance, the level of voltage to be input into the first comparator 101 and the second comparator 102 is adjustable, with a resultant possibility of selecting any of signals OUT1 to OUT3. For example, only the signal OUT1 can be rendered high in logic level, to be selected.

(3) The Switch SW1 is Off and the Switch SW2 is On:

As the switch SW2 is on, a current having inflown to the signal output terminal 10 inside the semiconductor integrated circuit outflows via the load resistor R2 to the grounding line.

The outflowing current $I_{out}$ to the grounding line can be expressed such that $I_{out}$=(potential at the signal output terminal 10)/(resistance value of the load resistor R2).

Therefore, a current of $I_1+I_{out}$ is conducted through the NPN transistor TP and the PNP transistor TN1, and by a function of the current mirror circuit, the PNP transistor TN2 also has a current of $I_1+I_{out}$ conducted therethrough. However, on the assumption that the magnitude $I_2$ of the constant current source 12 is set to be equal to the current value $I_1$, there occurs an excess of current of $(I_1+I_{out})-I_2=I_{out}$ in value. The excess of current is conducted via the node N to the load resistors R5 and R6.

Accordingly, the node N has a potential of ((resistance value r/2 of the load resistors R1 and R2)×$I_{out}$)+½ $V_{cc}$. In other words, the potential of the node N depends on the load resistor R2 of the control signal generating circuit and $I_{out}$ (that is a potential of the signal output terminal 10).

This means that, by selecting the load resistor R2 having a proper resistance, the level of voltage to be input to the first comparator 101 and the second comparator 102 is adjustable, with a resultant possibility of selecting any of signals OUT1 to OUT3. For example, only the signal OUT2 can be rendered high in logic level, to be selected.

Incidentally, in a case of the subsequent stage in which the threshold voltage $V_1$ of the first comparator 101 and the threshold voltage $V_2$ of the second comparator 102 are set to ⅔ $V_{cc}$ and ⅓ $V_{cc}$, respectively, it is necessary, for different control conditions to be selected between the above-noted cases (2) and (3), to have the currents $I_{in}$ and $I_{out}$ set to be sufficiently large in consideration of resistance values of the load resistors R5 and R6. More specifically, it is necessary to set them such that ⅓ $V_{cc}$>>potential at the node N in the case (2), and ⅔ $V_{cc}$<<potential at the node N in the case (3).

Further, it should be noted that the potential of the signal output terminal 10, which varies in dependence on the internally generated signal, causes the currents $I_{in}$ and $I_{out}$ to be varied too. Therefore, if the internally generated signal is a sine wave, for example, there appears a sine wave at the node N, as well. Accordingly, also in order for stable comparison actions to be achieved at the first comparator 101 and the second comparator 102 in the subsequent stage, such varying signal components are integrated at a capacitor C, to be transmitted as direct-current components.

As described hitherto, according to the first embodiment, a mode control circuit comprises a current mirror circuit constituted with a diode-connected PNP transistor TN1 and a PNP transistor TN2, an NPN transistor TP connected to the PNP transistor TN1 via their collectors and adapted to output from a signal output terminal 10 an internally generated signal generated inside an IC, a constant current source 11 connected to an emitter of the NPN transistor TP, a constant current source 12 connected to a collector of the PNP transistor TN2, a load resistor R5 connected in parallel to and between an emitter and the collector of the PNP transistor TN2, and a load resistor R6 connected in parallel to the constant current source 12. Further, there is provided an encoding unit constituted with a first comparator 101, a second comparator 102, and an encoder 110 and adapted to select anyone of a plurality of conditions in accordance with a voltage level of the collector of the PNP transistor TN2. Therefore, it is possible, by a connection of the signal output terminal 10 outside the mode control circuit, that is outside the IC, with a control signal generating circuit for thereby adjusting inflowing and outflowing currents to and from the signal output terminal 10, to change a voltage level to be given to the encoding means, with the possibility of using the signal output terminal 10 commonly for an output of the internally generated signal and for an input of a control signal.

In other words, it is possible to reduce the number of terminals in the IC. In particular, contrary to the general case of a common use of terminal in which an ensured control of a plurality of (three or more) conditions is difficult, the present embodiment permits an ensured control of a plurality of conditions.

Moreover, the control signal generating circuit is implemented by such a simple arrangement as comprising a load resistor R1 connected at one end thereof to a power supply line, a switch SW1 connected at one of contact terminals thereof to the other end of the load resistor R1 and at the other contact terminal to the signal output terminal 10, a load resistor R2 connected at one end thereof to a grounding line, and a switch SW2 connected at one of contact terminals thereof to the other end of the load resistor R2 and at the other contact terminal to the signal output terminal 10, thereby permitting a facilitated change for the signal output terminal 10 to function as a control terminal, without occupying a large peripheral area about the IC.

Figure 3:
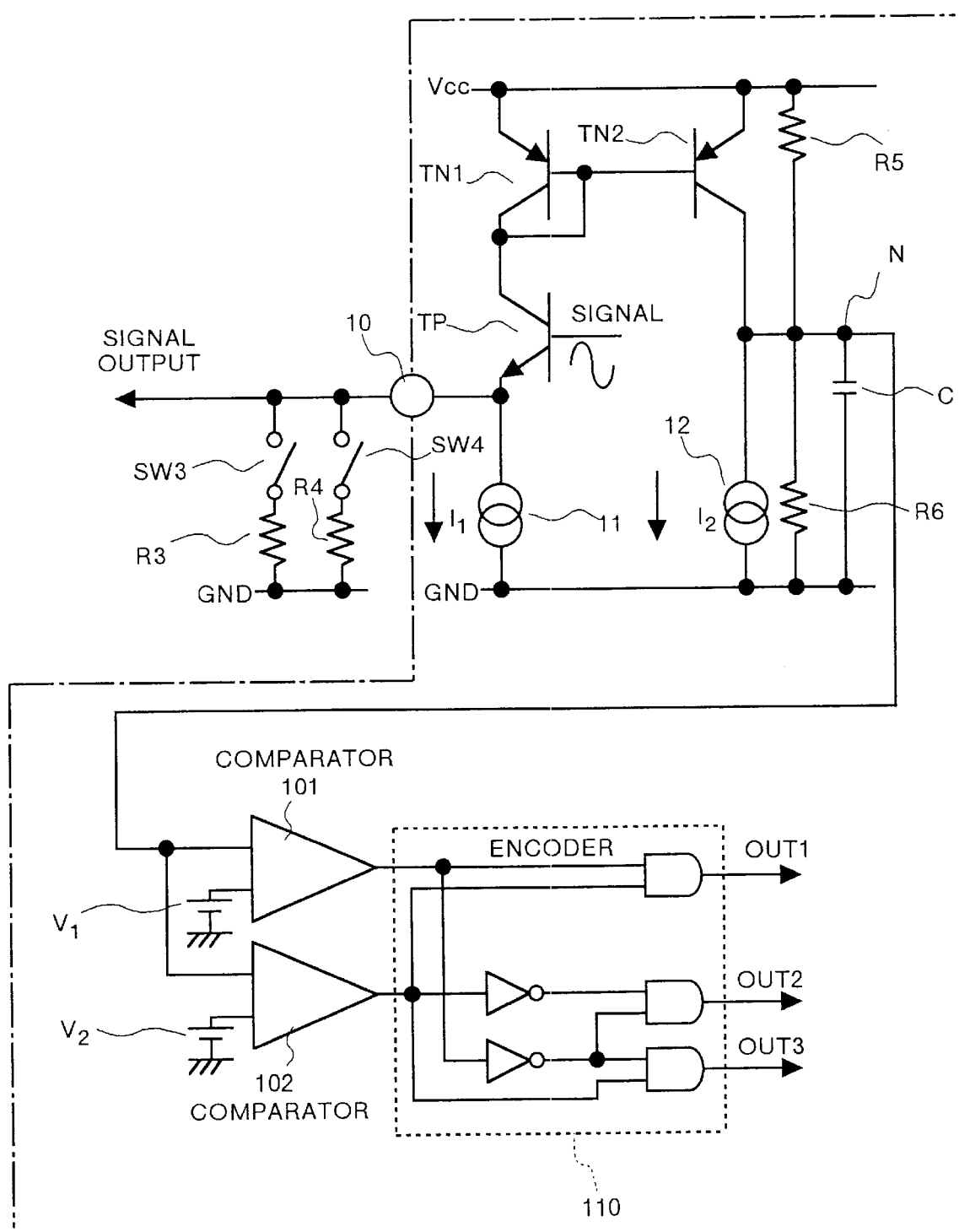
FIG. 3 is a circuit diagram of a mode control circuit according to a second embodiment of the present invention.

A mode control circuit according to a second embodiment of the invention will be explained below. FIG. 3 is a circuit diagram of the mode control circuit according to the second embodiment. The portions that have same functions to those show n in FIG. 1 are designated with same legends and their description is omitted. Particularly, the mode control circuit according to the second embodiment is different from FIG. 1 in that the signal generating circuit is made up by a load resistor R3 connected at one end thereof to a grounding line, a switch SW3 connected at one of contact terminals thereof to the other end of the load resistor R3 and at the other contact terminal to the signal output terminal 10, another load resistor R4 connected at one end thereof to the grounding line, and another switch SW4 connected at one of contact terminals thereof to the other end of the load resistor R4 and at the other contact terminal to the signal output terminal 10. Working of actions of the mode control circuit according to the second embodiment will be explained here. Following three cases may be considered depending u the states of the switches.

(1) Both the Switches SW3 and SW4 are Off:

Let us assume that the magnitude of the supply current from the constant current source 11 to be $I_1$ and that of a supply current from the constant current source 12 to be $I_2$.

As the switches SW3 and SW4 are both off, the mode control circuit makes an equivalent action to a condition in which the signal output terminal 10 is not connected to the control signal generating circuit. Therefore, the supply current $I_1$ from the constant current source 11 flows via the NPN transistor TP and through the PNP transistor TN1 without substantial attenuation. Because the PNP transistor TN1 constitutes a current mirror circuit together with the PNP transistor TN2, an identical current $I_1$ is conducted through the PNP transistor TN2 also.

If the supply current $I_2$ from the constant current source 12 is set such that $I_2 > I_1$ then as the current of $I_1$ is conducted at the PNP transistor TN2 by a function of the current mirror circuit, there occurs a lack of current of $I_2 - I_1 = I_{diff1}$ in value. To make up for the lack, the constant current source 12 suctions a current from the load resistors R5 and R6 at the node N. An equivalent circuit for this case is as shown in FIG. 2 with respect to the load resistors R1 and R2.

Therefore, the node N has a potential of $\frac{1}{2} V_{cc} - $((resistance value r/2 of the load resistors R1 and R2)$\times I_{diff1}$) In other words, the potential of the node N depends on the difference between the current value $I_1$ of the constant current source 11 and the current value $I_2$ of the constant current source 12.

This means that, by selecting the constant current source 11 and the constant current source 12 generating a current having a proper magnitude, the level of voltage to be input to the first comparator 101 and the second comparator 102 is adjustable, with a resultant possibility of selecting any of signals OUT1 to OUT3. For example, only the signal OUT1 can be rendered high in logic level, to be selected.

(2) The Switch SW3 is On and the Switch SW4 is Off:

As the switch SW3 is on, a current having inflown to the signal output terminal 10 inside a semiconductor integrated circuit outflows via the load resistor R3 to the grounding line.

The outflowing current $I_{out1}$ to the grounding line can be expressed such that $I_{out1}$ =(potential at the signal output terminal 10)/(resistance value of the load resistor R3).

Therefore, a current of $I_1 + I_{out1}$ is conducted through the NPN transistor TP and the PNP transistor TN1, and by a function of the current mirror circuit, the PNP transistor TN2 also has a current of $I_1 + I_{out1}$ is conducted therethrough. However, as the magnitude $I_2$ of the constant current source 12 is greater than the magnitude $I_1$, providing a relationship therebetween such that $I_2 = I_1 + I_{out1}$, no current flows through the node N, with a resultant potential at the node N, which is simply equal to a voltage to be imposed on the load resistor R6 when a power supply voltage $V_{cc}$ is divided by the load resistors R5 and R6.

Assuming now the resistances of the load resistor R5 and the load resistor R6 to be equal, the potential at the node N has a magnitude of $\frac{1}{2} V_{cc}$ (i.e. one half of the power supply voltage). This potential $\frac{1}{2} V_{cc}$ is then input into the first comparator 101 and the second comparator 102, causing described actions so that only a signal OUT3 showing a high logic level is selected, again on the assumption for a threshold voltage $V_1$ of the first comparator 101 to be $\frac{2}{3} V_{cc}$ and for a threshold voltage $V_1$ of the second comparator 102 to be $\frac{1}{3} V_{cc}$.

(3) The Switch SW3 is Off and the Switch SW4 is On:

As the switch SW4 is on, a current having inflown to the signal output terminal 10 inside the semiconductor integrated circuit outflows via the load resistor R4 to the grounding line.

The outflowing current $I_{out2}$ to the grounding line can be expressed such that $I_{out2}$=(potential at the signal output terminal 10)/(resistance value of the load resistor R4).

Therefore, a current of $I_1+I_{out2}$ is conducted through the NPN transistor TP and the PNP transistor TN1, and by a function of the current mirror circuit, the PNP transistor TN2 also has a current of $I_1+I_{out2}$ conducted therethrough. However, as the magnitude 2 of the constant current source 12 is greater than the magnitude $I_1$, providing a relationship therebetween such that $I_2=I_1+I_{out1}$ as described and that $I_2<I_1+I_{out2}$, there occurs an excess of current of $(I_1+I_{out2})-I_2=(I_1+I_{out2})-(I_1+I_{out1})=I_{out2}31$ $I_{out1}=I_{diff2}$ in value. The excess of current is conducted via the node N to the load resistors R5 and R6.

Accordingly, the node N has a potential of ((resistance value r/2 of the load resistors R1 and R2)×$I_{diff2}$)+½ $V_{cc}$. In other words, the potential of the node N depends on the potential of the signal output terminal 10 and the load resistors R3 and R4 of the control signal generating circuit.

This means that, by selecting the load resistors R3 and R4 having proper resistances, the level of voltage to be input to the first comparator 101 and the second comparator 102 is adjustable, with a resultant possibility of selecting any of signals OUT1 to OUT3. For example, only the signal OUT2 can be rendered high in logic level, to be selected.

Incidentally, in a case of the subsequent stage in which a threshold voltage $V_1$ of the first comparator 101 and a threshold voltage $V_2$ of the second comparator 102 are set to $\frac{2}{3} V_{cc}$ and $\frac{1}{3} V_{cc}$, respectively, it is necessary, for different control conditions to be selected between the above-noted cases (1) and (3), to have the currents $I_{diff1}$ and $I_{diff2}$ set to be sufficiently large in consideration of resistance values of the load resistors R5 and R6. More specifically, it is necessary to set them such that $\frac{1}{3} V_{cc}$ >>potential at the node N in the case (1), and $\frac{2}{3} V_{cc}$ <<potential at the node N in the case (3).

Further, it should be noted that the potential of the signal output terminal 10, which varies in dependence on the internally generated signal, causes the currents $I_{out1}$ and $I_{out2}$ to be varied too. Therefore, if the internally generated signal is a sine wave, for example, there appears a sine wave at the node N, as well. Accordingly, also in order for stable comparison actions to be achieved at the first comparator 101 and the second comparator 102 in the subsequent stage, such varying signal components are integrated at a capacitor C, to be transmitted as direct-current components.

As described hitherto, according to the second embodiment, a mode control circuit can enjoy advantages of the first embodiment. In addition, a control signal generating circuit is implemented by such a simple arrangement as comprising a load resistor R3 connected at one end thereof to a grounding line, a switch SW3 connected at one of contact terminals thereof to the other end of the load resistor R3 and at the other contact terminal to a signal output terminal 10, a load resistor R4 connected at one end thereof to the grounding line, and a switch SW4 connected at one of contact terminals thereof to the other end of the load resistor R4 and at the other contact terminal to the signal output terminal 10, thereby permitting a facilitated change for the signal output terminal 10 to function as a control terminal, without occupying a large peripheral area about an IC. In particular, the load resistor R4 and R5 are disposed on the grounding line side, permitting easier design and control. Identical effect can be achieved if the load resistor R4 and R5 are disposed on the power supply line side.

Figure 4:
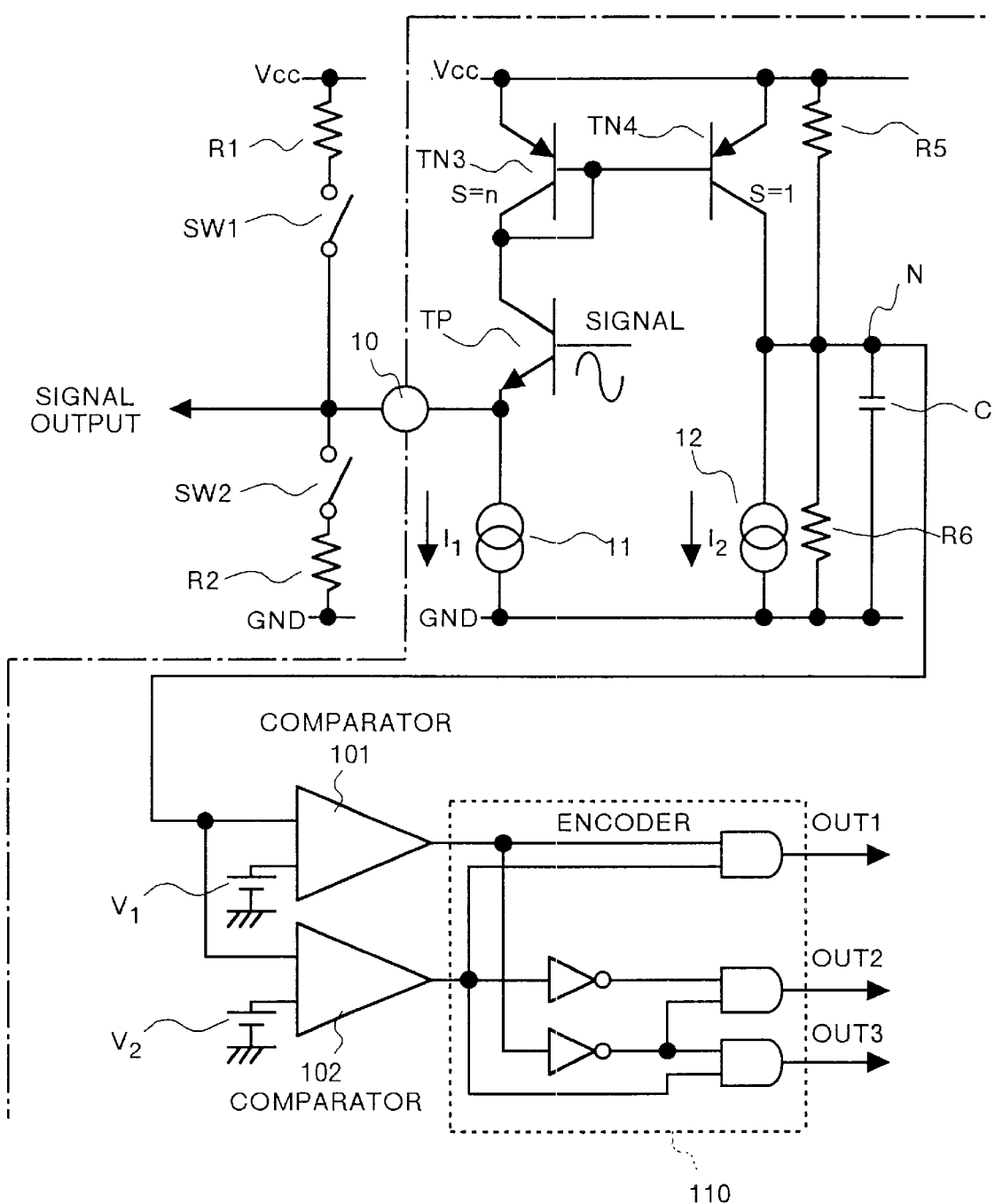
FIG. 4 is a circuit diagram of a mode control circuit according to a third embodiment of the present invention.

A mode control circuit according to a third embodiment of the invention is explained below. FIG. 4 is a circuit diagram of the mode control circuit according to the second embodiment. Portions having similar functions to those shown in FIG. 1 are designated with same legends and their description is omitted. The mode control circuit according to the third embodiment is almost the same as that of the first embodiment. The difference is that the PNP transistors TN1 and TN2 shown in FIG. 1 are substituted by PNP transistors TN3 and TN4 having a transistor size ratio of n to 1, respectively. Working of the mode control circuit according to the present embodiment. Following three cases may be considered depending upon the states of the switched.

(1) Both the Switches SW1 and SW2 are Off:

Consider that the switches SW1 and SW2 are both turned off. Further, let us assume that the constant current source 11 outputs a supply current of magnitude $I_1$ and the constant current source 12 outputs a supply current of magnitude $I_2$.

As the switches SW1 and SW2 are both off, the mode control circuit makes an equivalent action to a condition in which the signal output terminal 10 is not connected to a control signal generating circuit. Therefore, the supply current $I_1$ from the constant current source 11 flows via an NPN transistor TP and through the PNP transistor TN3 without substantial attenuation. Because the PNP transistor TN3 constitutes a current mirror circuit together with the PNP transistor TN4, an identical current $I_1$ is conducted through the PNP transistor TN4 also.

As the transistor sizes of the PNP transistors TN3 and TN4 have a ratio of n:1, there is conducted through the PNP transistor TN4 one n-th of a current flowing through the PNP transistor TN3. Therefore, by setting the supply current $I_2$ from the constant current source 12 such that $I_2=I_1/n$, the PNP transistor TN4 has a collector current of $I_2$. No current flows through the node N, with a resultant potential at the node N, which is simply equivalent to a voltage to be imposed on a load resistor R6 when a power supply voltage $V_{cc}$ is divided by a load resistor R5 and the load resistor R6.

Assuming now that the resistances of the load resistor R5 and the load resistor to be equal, the potential at the node N has a value of ½ $V_{cc}$ (i.e. one half of the power supply voltage). This potential ½ $V_{cc}$ is then input into the first comparator 101 and the second comparator 102, causing actions explained in connection to conventional mode control circuit, so that only a signal OUT3 of high logic level is output, again on the assumption for a threshold voltage $V_1$ of the first comparator 101 to be $\frac{2}{3} V_{cc}$ and for a threshold voltage $V_2$ of the second comparator 102 to be $\frac{1}{3} V_{cc}$.

(2) The Switch SW1 is On and the Switch SW2 is Off:

As the switch SW1 is on, the signal output terminal 10 has a current inflowing thereto via the load resistor R1. The magnitude of the inflowing current $I_{in}$ is $I_{in}$=(the power supply voltage $V_{cc}$–potential at the signal output terminal 10)/(resistance of the load resistor R1).

Therefore, a current of $I_1-I_{in}$ is conducted through the NPN transistor TP and the PNP transistor TN3, and by a function of the current mirror circuit as well as by the transistor size ratio, the PNP transistor TN4 has a current of $(I_1-I_{in})/n$ conducted therethrough. However, as the magnitude $I_2$ of the current generated by the constant current source 12 is set to be a value $I_1/n$, there occurs a lack of current of $I_2-(I_1-I_{in})/n = I_{in}/n$ in value. To make up for the lack, the constant current source 12 suctions a current from load resistors R5 and R6 at the node N.

Further, as shown in FIG. 2, the node N has a potential of ½ $V_{cc}$−((resistance value r/2 of the load resistors R1 and R2)×$I_{in}$/n). In other words, the potential of the node N depends on the load resistor R1 of the control signal generating circuit and $I_{in}$/n (that is a potential of the signal output terminal 10).

This means that, by selecting the load resistor R1 having a proper resistance, the level of voltage to be input to the first comparator 101 and the second comparator 102 is adjustable, with a resultant possibility of selecting any of signals OUT1 to OUT3. For example, only the signal OUT1 can be rendered high in logic level, to be selected.

(3) The Switch SW1 is Off and the Switch SW2 is On:

As the switch SW2 is on, a current having inflown to the signal output terminal 10 inside the semiconductor integrated circuit outflows via the load resistor R4 to the grounding line.

The outflowing current $I_{out}$ to the grounding line can be expressed such that $I_{out}$=(potential at the signal output terminal 10)/(resistance of the load resistor R2).

Therefore, a current of $I_1+I_{out}$ is conducted through the NPN transistor TP and the PNP transistor TN3, and by a function of the current mirror circuit as well as by the transistor size ratio, the PNP transistor TN4 has a current of $(I_1+I_{out})/n$ conducted therethrough. However, as the magnitude $I_2$ of the current generated by the constant current source 12 is set to be $I_1/n$, there occurs an excess of current of $(I_1+I_{out})/n-I_2=I_{out}/n$ in value. The excess of current is conducted via the node N to the load resistors R5 and R6.

Accordingly, the node N has a potential of ((resistance value r/2 of the load resistors R1 and R2)×$I_{out}$)+½ $V_{cc}$. In other words, the potential of the node N depends on the load resistor R2 of the control signal generating circuit and $I_{out}$/n (that is a potential of the signal output terminal 10).

This means that, by selecting the load resistors R2 having a proper resistance, the level of voltage to be input to the first comparator 101 and the second comparator 102 is adjustable, with a resultant possibility of selecting any of signals OUT1 to OUT3. For example, only the signal OUT2 can be rendered high in logic level, to be selected.

Incidentally, in a case of the subsequent stage in which a threshold voltage $V_1$ of the first comparator 101 and a threshold voltage $V_2$ of the second comparator 102 are set to ⅔ $V_{cc}$ and ⅓ $V_{cc}$, respectively, it is necessary, for different control conditions to be selected between the above-noted cases (2) and (3), to have the currents $I_{in}$ and $I_{out}$ set to be sufficiently large in consideration of resistance values of the load resistors R5 and R6. More specifically, it is necessary to set them such that ⅓ $V_{cc}$>>potential at the node N in the case (2), and ⅔ $V_{cc}$<<potential at the node N in the case (3).

Further, it should be noted that the potential of the signal output terminal 10, which varies in dependence on an internally generated signal, causes the currents $I_{in}$ and $I_{out}$ to be varied too. Therefore, if the internally generated signal is a sine wave, for example, there appears a sine wave at the node N, as well. Accordingly, also in order for stable comparison actions to be achieved at the first comparator 101 and the second comparator 102 in the subsequent stage, such varying signal components are integrated at a capacitor C, to be transmitted as direct-current components.

As described hitherto, according to the third embodiment, a mode control circuit comprises a current mirror circuit constituted with a diode-connected PNP transistor TN3 and a 1/n PNP transistor TN4 of the size of a PNP transistor TN3, an NPN transistor TP connected to the PNP transistor TN3 via their collectors and adapted to output from a signal output terminal 10 an internally generated signal generated inside an IC, a constant current source 11 connected to an emitter of the NPN transistor TP, a constant current source 12 connected to a collector of the PNP transistor TN4, a load resistor R5 connected in parallel to and between an emitter and the collector of the PNP transistor TN4, a load resistor R6 connected in parallel to the constant current source 12, and an encoding unit constituted with a first comparator 101, a second comparator 102, and an encoder 110 and adapted to select anyone of a plurality of conditions in accordance with a voltage level of the collector of the PNP transistor TN4, and hence is allowed, by a connection of the signal output terminal 10 outside the mode control circuit, that is outside the IC, with a control signal generating circuit for thereby adjusting inflowing and outflowing currents to and from the signal output terminal 10, to change a voltage level to be given to the encoding unit, with the possibility of using the signal output terminal 10 commonly for an output of the internally generated signal and for an input of a control signal. In other words, it is thereby enabled to enjoy like advantages to the first embodiment.

Moreover, as inflowing and outflowing currents to and from the load resistors R5 and R6 are rendered 1/n and also in order to stabilize comparison actions of the encoding unit in a subsequent stage, resistances of the load resistors R5 and R6 need to be enlarged, and by the enlargement of resistances of the load resistors R5 and R6 it is allowed for the node N to have an increased impedance, so that the capacitor C for removal of undesirable signal components can have a smaller capacitance. Generally, the capacitor to be installed in an IC occupies a large area, thus mostly constituting an obstacle to the miniaturization of IC size. However, in the mode control circuit according to the present embodiment, the capacitor C having a smaller capacitance may be used, thus making it possible to render compact the IC size, as well.

As described hitherto, according to the present invention, by a current given from outside to a signal output terminal or suctioned out of the signal output terminal, the mode control unit is operated to have a voltage level changed to be given to an encoder in a subsequent stage, so that the signal output terminal can concurrently serve not simply for outputting a signal generated inside a semiconductor integrated circuit, but also as a control terminal for external current control, thus permitting the semiconductor integrated circuit to have a reduced number of terminals.

Further, the mode control unit can be constituted simply with three transistors, two constant current sources, and two load resistors, so that by installation of this mode control circuit it is possible to keep other circuits in the semiconductor integrated circuit from being restricted to occupy their areas.

Further, means for implementing the input of the predetermined current to the signal output terminal from outside or the output of the predetermined current from the signal output terminal to outside can be constituted simply with a load resistor for giving a current from a power supply line to the signal output terminal, a load resistor for suctioning a current from a grounding line and the signal output terminal, and two switches for controlling the respective currents to inflow or outflow, thus permitting a facilitated change for the signal output terminal to function as a control terminal, without occupying a large peripheral area about the semiconductor integrated circuit.

Further, means for having the signal output terminal outputting predetermined currents therefrom can be constituted simply with two load resistors for suctioning the currents from the signal output terminal to a grounding line, and two switches means for controlling the respective currents to be suctioned, thus permitting a facilitated change for the signal output terminal to function as a control terminal, without occupying a large peripheral area about the semiconductor integrated circuit.

Further, means for inputting predetermined currents from outside to the signal output terminal can be constituted simply with two load resistors for giving the currents from a power supply line to the signal output terminal, and two switches for controlling the respective currents to inflow, thus permitting a facilitated change for the signal output terminal to function as a control terminal, without occupying a large peripheral area about the semiconductor integrated circuit.

Further, the second constant current source can have a current reduced to 1/n of a current of the first constant current source, and the first and second load resistors are allowed to have increased values to give a signal of a stable potential level to the post-staged encoding means, whereby the capacitance of a capacitor C can be reduced, thus permitting a reduced size of semiconductor integrated circuit to be achieved.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A mode control circuit comprising:
   an encoding unit which makes any of a plurality of signal outputs effective in accordance with a given signal level; and
   a mode control unit which changes a potential level supplied to said encoding unit, at a signal output terminal, outputting an internally generated signal generated inside a semiconductor integrated circuit, in accordance with an input of a specified current or with an output of a specified current from said signal output terminal.

2. The mode control circuit according to claim 1, wherein the mode control unit comprises:
   a current mirror section including a diode-connected first transistor and a second transistor having respective collectors and emitters, for supplying a potential at the collector of said second transistor to said encoding unit;
   a third transistor having a collector and emitter and connected to said first transistor via the collectors of said first and third transistors and outputting the internally generated signal output at the emitter of said third transistor;
   a first constant current source connected to the emitter of said third transistor;
   a second constant current source connected to the collector of said second transistor;
   a first load resistor connected in parallel with and between an emitter and the collector of said second transistor; and
   a second load resistor connected in parallel with said second constant current source.

3. The mode control circuit according to claim 1, further comprising, for imputting the specified current to the signal output terminal or the output of the specified current from the signal output terminal, a control signal generating unit comprising:
   a first load resistor connected at a first end to a power supply line;
   a first switch connected at a first contact terminal to a second end of said first load resistor and at a second contact terminal to said signal output terminal;
   a second load resistor connected at a first end to a grounding line; and
   a second switch connected at a first contact terminal to a second end of said second load resistor and at a second contact terminal to said signal output terminal.

4. The mode control circuit according to claim 1, further comprising, for inputting the specified current to the signal output terminal or the output of the specified current from the signal output terminal; a control signal generating unit comprising:
   a first load resistor connected at a first end to a grounding line;
   a first switching unit connected at a first contact terminal to second end of said first load resistor and at a second contact terminal to said signal output terminal;
   a second load resistor connected at a first end to said grounding line; and
   a second switch connected at a first contact terminal to a second end of said second load resistor and at a second contact terminal.

5. The mode control circuit according to claim 1, further comprising, for implementing the input of the specified current to the signal output terminal or the output of the specified current from the signal output terminal, a control signal generating unit including:
   a first load resistor connected at a first end to a grounding line;
   a first switching unit connected at first contact terminal to second end of said first load resistor and at a second contact terminal to said signal output terminal;
   a second load resistor connected at a first end to said power supply line; and
   a second switch connected at a first contact terminal to a second end of said second load resistor and at a second contact terminal to said signal output terminal.

6. The mode control circuit according to claim 2, further comprising a capacitor connected between the emitter of said second transistor and said grounding line, wherein
   a ratio of transistor sizes of said first transistor to said second transistor is n to 1, and
   a ratio of the current generated by said first constant current source and said second constant current source is $|n \text{ to } 1|$.

7. The mode control circuit according to claim 3, further comprising a capacitor connected between the emitter of said second transistor and said grounding line, wherein
   a ratio of transistor sizes of said first transistor and said second transistor is n to 1, and
   a ratio of the current generated by said first constant current source and said second constant current source is $|n \text{ to } 1|$.

8. The mode control circuit according to claim 4, further comprising a capacitor connected between the emitter of said second transistor and said grounding line, wherein
   a ratio of transistor sizes of said first transistor to said second transistor is n to 1, and
   a ratio of the current generated by said first constant current source and said second constant current source is $|n \text{ to } 1|$.

9. The mode control circuit according to claim 5, further comprising a capacitor connected between the emitter of said second transistor and said grounding line, wherein
   a ratio of transistor sizes of said first transistor to said second transistor is n to 1, and
   a ratio of the current generated by said first constant current source and said second constant current source is $|n \text{ to } 1|$.

\* \* \* \* \*